United States Patent [19]

Komatsu et al.

[11] 4,176,288
[45] Nov. 27, 1979

[54] ZERO VOLTAGE SWITCHING SOLID STATE RELAY

[75] Inventors: Isamu Komatsu, Takahagi; Toru Sugawara; Tsukasa Yamauchi, both of Hitachi, all of Japan

[73] Assignee: Hitachi, Ltd., Japan

[21] Appl. No.: 830,663

[22] Filed: Sep. 6, 1977

[30] Foreign Application Priority Data

Sep. 6, 1976 [JP] Japan .................. 51-107145

[51] Int. Cl.² .......................................... H03K 17/72
[52] U.S. Cl. ............................ 307/252 A; 307/252 B; 307/252 UA; 307/311; 323/22 SC
[58] Field of Search ........ 307/252 UA, 252 B, 252 N, 307/252 W, 311; 323/18, 22 SC

[56] References Cited
U.S. PATENT DOCUMENTS

| 3,372,328 | 3/1968 | Pinckaers | 323/22 SC |
| 3,758,793 | 9/1973 | Pascente | 307/252 UA |
| 3,815,668 | 6/1974 | Carlson | 307/252 UA |
| 3,902,080 | 8/1975 | St. Clair et al. | 307/252 UA |

Primary Examiner—John Zazworsky
Attorney, Agent, or Firm—Craig and Antonelli

[57] ABSTRACT

A solid state relay or controlled switch for connecting an AC power source to a load includes a solid state switching circuit in which a semiconductor controlled rectifier element, such as a photothyristor, thyristor or light-AC controlled element, is ignited by an external control signal, thereby to feed a load with an alternating current. A zero voltage switching circuit which executes switching when the instantaneous value of the amplitude of the supply voltage of the AC load current is zero or a value close thereto is connected to the rectifier element. As an improvement, a series circuit consisting of a resistor and a capacitor are connected between the base and emitter of a transistor in the zero voltage switching circuit. Thus, a zero voltage switching solid state relay whose withstand voltage build-up rate is enhanced and whose switching is endowed with a hysteresis characteristic is provided.

8 Claims, 5 Drawing Figures

ZERO VOLTAGE SWITCHING SOLID STATE RELAY

BACKGROUND OF THE INVENTION

1. Field of the Invention

This invention relates to a zero voltage switching solid state relay. The term "solid state relay" as herein used is intended to refer to a solid state switching circuit which ignites a semiconductor controlled rectifier element, such as a photothyristor, thyristor or light-AC controlled element, by means of an external control signal, thereby to feed a load with an alternating current.

An example of such a solid state relay is a solid state switching circuit using photon coupling. In such a solid state switching circuit using photon coupling, a light emitting element, such as a light emitting diode, is caused to emit light in response to an external control signal, and the light is received by a light receptor, such as photothyristor, thereby to ignite the photothyristor and feed a load with an alternating current.

2. Description of the Prior Art

The zero voltage switching solid state relay of the type to which this invention is directed will be explained by taking as an example a solid state switching circuit of the photon coupling type which has been employed in the prior art, such as described in U.S. Pat. No. 3,816,763 to Korn et al. When a predetermined input electric signal is applied across the input terminals of a light emitting diode, the diode emits light in a quantity corresponding to the magnitude of the input electric signal. A photothyristor disposed opposite to the light emitting diode receives the light emitted thereby and is biased into the conductive state. When the photothyristor has become conductive, a load, an AC power source, the photothyristor and a diode bridge which are connected to output terminals of the solid state switching circuit constitute a closed circuit, so that a current flows through the load.

The solid state switching circuit is provided with a zero voltage switching circuit which consists of a transistor and a resistor connected to the gate of the photothyristor. The photothyristor is ignited only when the voltage of the AC power source is near zero, and it does not operate when the voltage is great. Accordingly, in the case where the light entering from the light emitting diode is of sufficient magnitude, and when the voltage of the AC power source is near zero, the photothyristor is ignited to permit the load current to flow through the load, so that the zero voltage function is performed.

The zero voltage switching circuit effectively operates also in point of the withstand quantity of voltage build-up rate (dV/dt). More specifically, when an electrical noise is externally superposed on the AC power source, the photothyristor is ignited by the electrical noise. However, when the transistor in the zero voltage switching circuit is rendered conductive by the electrical noise, the photothyristor becomes difficult to ignite. Therefore, the withstand dV/dt of the circuit is sharply enhanced.

Accordingly, the zero voltage switching solid state relay of the prior art is capable of providing the zero voltage switching function and the high withstand dV/dt. Disadvantageously, however, it has no hysteresis characteristic in the switching operation.

More specifically, the zero voltage switching solid state relay of the prior art has its conductive and nonconductive states inverted by a certain point of value of the input control signal. The conductive and nonconductive states are therefore inverted by a small change of the input signal or a change of the ambient temperature, so that the stability is unsatisfactory.

SUMMARY OF THE INVENTION

An object of this invention is to provide a zero voltage switching solid state relay which, with a simple construction, enhances the withstand quantity of the voltage build-up rate and endows the switching operation with a hysteresis characteristic.

This invention is characterized by the fact that a series circuit consisting of a resistor and a capacitor is connected in parallel with a resistor which is connected between the base and emitter of a transistor in a zero voltage switching circuit. It is applicable to a solid state switching circuit employing a semiconductor controlled rectifier element which is ignited by an external control signal, thereby to feed a load with an alternating current, or a semiconductor controlled rectifier element which is ignited by an external control signal, thereby to ignite an AC controlled element for feeding a load with an alternating current. The term "semiconductor controlled rectifier element" referred to herein signifies a photothyristor, a thyristor, a light-AC controlled element, etc.

With reference to the embodiments described below, it will be better understood that the desired objects can be accomplished by the present invention.

DESCRIPTION OF THE PREFERRED EMBODIMENTS

Figure 1:
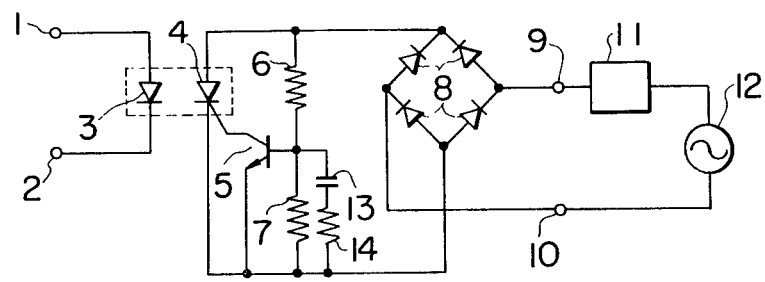
FIG. 1 is a schematic circuit diagram of an embodiment of a zero voltage switching solid state relay according to this invention.

FIG. 1 is a diagram of an embodiment of the invention for the case where a zero voltage switching solid state relay is applied to a solid state switching circuit of the photon coupling type.

When a predetermined input electric signal is applied across input terminals 1 and 2, a light emitting diode 3 emits light in a quantity corresponding to the magnitude of the input electric signal. A photothyristor 4 which is disposed opposite the light emitting diode 3 receives the light and becomes conductive. When the photothyristor 4 has become conductive, a load 11 and an AC power source 12 which are connected across output terminals 9 and 10 of the solid state switching circuit and the photothyristor 4 and a diode bridge 8 form a closed circuit, so that a current flows through the load 11.

The solid state switching circuit is provided with a zero voltage switching circuit which consists of an N-P-N transistor 5 and resistors 6 and 7. The zero voltage switching circuit operates so as to ignite the photothyristor 4 only when the voltage of the AC power source 12 is near zero, and to prevent ignition of the photothyristor 4 when the voltage is of significant value. Thus, it acts to abate electrical noises which are generated at switching. Further, the gate and cathode of the photothyristor 4 are respectively connected to the collector and emitter of the transistor 5. When the transistor 5 is in the conductive state, the short-circuit state is established between the gate and cathode of the photothyristor 4, so that the photothyristor 4 is not ignited even if it receives a sufficient quantity of light from the light emitting diode 3. On the other hand, when the transistor 5 is in the nonconductive state, the photothyristor 4 is not subject to the restriction by the transistor 5, so that it is ignited in case of a sufficiently large quantity of received light.

Whether the transistor 5 is conductive or nonconductive is determined by the voltages applied across the resistors 6 and 7; in other words, the AC voltage from the AC power source 12, which is subjected to full-wave rectification by the diode bridge 8, is divided by resistors 6 and 7. If this voltage has a value sufficient to render the transistor 5 conductive, the photothyristor 4 is not ignited even when it receives a sufficient quantity of light. In consequence, only in the case where the light entering from the light emitting diode 3 is sufficient and where the voltage of the AC power source 12 is near zero, will the photothyristor 4 be ignited and a load current flow through the load 11.

In the case where the zero voltage switching circuit consists only of the transistor 5 and the resistors 6 and 7, the solid state switching circuit has the disadvantage of lacking a hysteresis characteristic in the switching operation as stated previously, though it is endowed with the zero voltage switching function and the high withstand voltage build-up rate.

In order to provide the switching operation with a hysteresis characteristic, there has been proposed, for example, a method in which a Schmitt circuit is used on the input side. Further, the inventor has proposed a circuit arrangement in which only a capacitor is connected in parallel with the resistor 7 of the foregoing solid state switching circuit thereby to provide the switching operation with a hysteresis characteristic.

The principle of this circuit arrangement is as follows. The voltages applied and allotted to the resistors 6 and 7 are different between the time when the current is flowing through the load and the time when it is not. Therefore, a difference arises in the quantity of the charges stored in the capacitor, and the difference occurs in the impedance of the transistor 5. Accordingly, the ignition sensitivity of the photothyristor 4 varies, and the hysteresis characteristic is created. Since this circuit system can achieve the object by the addition of one capacitor, it is much simpler in construction than the Schmitt circuit.

The addition of the capacitor, however, incurs a lowering in the withstand quantity of voltage build-up rate (withstand dV/dt). The reason for this is that, when a high-speed electrical noise is exerted, it flows on the capacitor side, not through the base and emitter of the transistor 5, so that the impedance of the transistor 5 is not lowered and the photothyristor 4 becomes prone to ignite.

This invention provides that a series circuit consisting of a capacitor 13 and a resistor 14 is added to the prior art solid state switching circuit which is made up of the transistor 5 and the resistors 6 and 7. Also, in the case of the solid state switching circuit of this construction, the light emitting diode 3 emits light by the application of the input electric signal, and the photothyristor 4 having received the light ignites to allow the load current to flow through the load 11. In contrast to the circuit previously described, however, the hysteresis characteristic is obtained, as stated before, on the basis of the fact that the quantities of charges stored in the capacitor 13 differ between the time when the load current flows and the time when it does not flow. Furthermore, even when a high-speed electrical noise is impressed, it flows also through the base and emitter of the transistor 5 owing to the presence of the resistor 14 so as to lower the impedance of the transistor 5. Therefore, the photothyristor 4 is difficult to ignite, and a high withstand dV/dt is exhibited.

Figure 2:
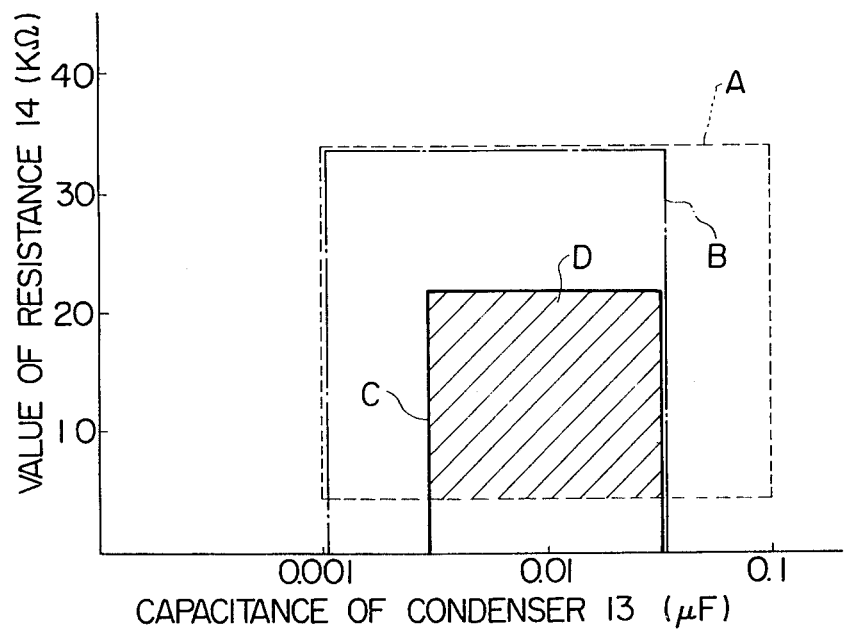
FIG. 2 is a diagram showing the relations of various characteristics to the values of a resistor and a capacitor of a solid state switching circuit in the circuit of FIG. 1.

By way of example, the cases where the resistor 14 is present and where it is absent in the solid state switching circuit of FIG. 1 will be compared. Assuming that the value of the capacitor 13 is 0.01 $\mu F$ and that the value of resistor 14 is 10 k$\Omega$, the withstand dV/dt is below 10 V/$\mu s$ in the absence of the resistor 14, and it is enhanced to above 100 V/$\mu s$ in the presence of the resistor 14. An example of a range of values of the capacitor 13 and the resistor 14 which satisfies the withstand dV/Dt, the zero voltage switching function and the hysteresis characteristic is illustrated in FIG. 2. In the figure, the abscissa represents the capacitance (in $\mu F$) of the capacitor 13, while the ordinate represents the resistance (in k$\Omega$) of the resistor 14. Letter A indicates a region in which the withstand dV/dt is at least 100 V/$\mu s$, letter B indicates a zero voltage starting region, and letter C indicates a hysteresis switching region. A region D in which these regions overlap (a range hatched in the figure) is a good operating region for achieving the object of this invention.

Figure 3:
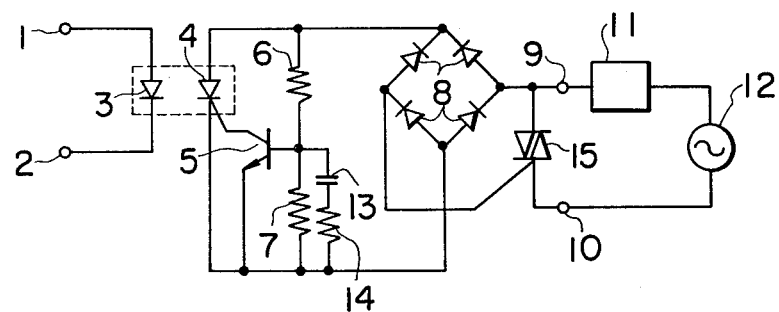
FIG. 3 is a schematic circuit diagram of another embodiment of this invention which is a zero voltage switching solid state relay for controlling a large current.

FIG. 3 shows an embodiment, in which in order to cause a large current to flow through the load 11 by the construction of FIG. 1, an AC controlled element 15 is added, and a current flowing through the photothyristor 4 is used as a gate current for rendering the AC controlled element 15 conductive. Upon the application of an input electrical signal, the light emitting diode 3 emits light, the photothyristor 4 having received the light ignites and becomes conductive, and a current flows to the gate of the AC controlled element 15. Thus, the AC controlled element 15 becomes conductive. A circuit which consists of the AC power source 12, the load 11 and the AC controlled element 15 is closed, and an alternating current flows through the load 11. The solid state switching circuit of this construction is effective for the control of loads of about 10 Amp.

Figure 4:
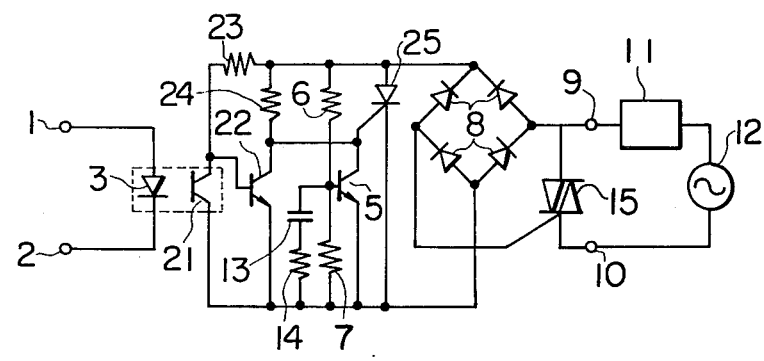
FIG. 4 is a schematic circuit diagram of still another embodiment of this invention which employs a phototransistor as a light receptor element.

An embodiment in FIG. 4 employs a phototransistor 21 as a light receptor, an amplifying transistor 22 and a thyristor 25, thereby to remove the photothyristor. According to this circuit, when an input electric signal is applied, the light emitting diode 3 emits light, and the phototransistor 21 having received the light becomes conductive. As a consequence, a current flowing through a resistor 23 flows to the phototransistor 21, and it does not flow to the base of the transistor 22. Therefore, the current flowing through a resistor 24 will not flow through the cut-off transistor 22, but becomes a gate current of the thyristor 25, so that the thyristor 25 is ignited. Thus, the load current flows through the load 11. At this time, a circuit which is made up of the transistor 5, the resistors 6, 7, and 14, and the capacitor 13 operates similarly to the circuit arrangement of the constituents with the same symbols in FIG. 1 or FIG. 3, and it can achieve similar effects. In particular, the solid state switching circuit of this embodiment has the capability of switching in response to a very small input electric signal, for example below 1 mA.

Figure 5:
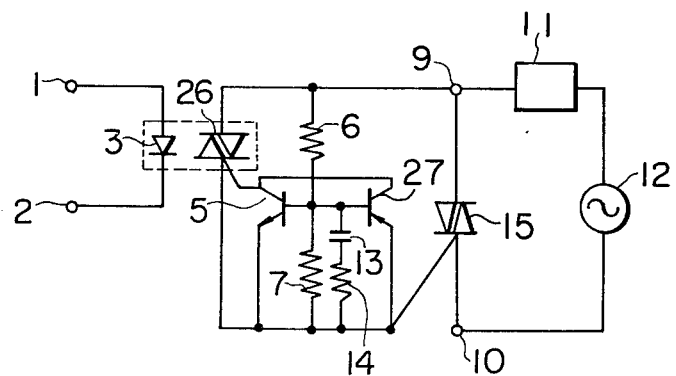
FIG. 5 is a schematic circuit diagram of yet another embodiment of this invention which employs a light-AC controlled element as a light receptor element.

An embodiment in FIG. 5 uses a light-AC controlled element 26 as a light receptor, thereby to remove the diode bridge. When an input electric signal is applied to this solid state switching circuit, the light emitting diode 3 emits light, the light-AC controlled element 26 having received the light becomes conductive, and a load current flows through the load 11. At this time, a circuit which consists of an N-P-N transistor 5 adapted to operate when the side of the terminal 9 is at a positive potential, a P-N-P transistor 27 adapted to operate when the side of the terminal 9 is at a negative potential, the resistors 6, 7 and 14, and the capacitor 13 operate similarly to the circuit arrangement in FIG. 1, FIG. 3, or FIG. 4, and it can achieve similar effects. In particular, the solid state switching circuit of this embodiment does not use the diode bridge, but has the transistor 27 added, and hence, it has the effect that a voltage drop component attributed to the diode bridge is not involved and that the number of components is small.

Although, in the above embodiments, description has been made of the construction wherein the light signal is transmitted to ignite the photothyristor, the light-AC controlled element or the thyristor, the invention is not restricted to this construction but it is also effective, a construction wherein in case of transferring an electric signal to ignite a thyristor by a pulse transformer, the zero voltage switching function is endowed by adding the transistor 5, the resistors, etc., between the gate and cathode of this thyristor.

When, in the circuit arrangement shown in FIG. 4 or FIG. 5, the AC controlled element 15 is incorporated between the terminals 9 and 10, a current flowing through the thyristor 25 (FIG. 4) or the light-AC control element 26 (FIG. 5) is used as a gate current for rendering the AC control element 15 conductive. Thus, the circuit of FIG. 4 or FIG. 5 can be applied to the control of a large current load of 10 Amp. or so.

It is needless to say that the present invention is not restricted to the scope of the foregoing embodiments only, but that it is widely applicable without departing from the technical idea of the invention.

As set forth above, the zero voltage switching solid state relay of this invention enhances the withstand voltage build-up rate and simultaneously endows the switching with the hysteresis characteristic by the use of the simple construction, thereby to make possible the provision of a solid state power switch of stable operation. It is greatly effective in industry.

What is claimed is:

1. In a zero voltage switching solid state relay having a semiconductor controlled rectifier element which is ignited by an external control signal to feed a load with an alternating current, a transistor whose collector and emitter are respectively connected to the gate and the cathode of said semiconductor controlled rectifier element, and a voltage divider including first and second resistors connected in series across said rectifier element, the point of connection of said resistors being connected to the base of said transistor; the improvement comprising: a capacitor and a resistor connected in series between the base and the emitter of said transistor and which has a time constant sufficient to attain a hysteresis characteristic, and said semiconductor controlled rectifier element is a photothyristor which is operated by a light emitting diode adapted to emit light by the external control signal.

2. In a zero voltage switching solid state relay having a semiconductor controlled rectifier element which is ignited by an external control signal to feed a load with an alternating current, a transistor whose collector and emitter are respectively connected to the gate and the cathode of said semiconductor controlled rectifier element, and a voltage divider including first and second resistors connected in series across said rectifier element, the point of connection of said resistors being connected to the base of said transistor; the improvement comprising: a capacitor and a resistor connected in series between the base and the emitter of said transistor and which has a time constant sufficient to attain a hysteresis characteristic, and said semiconductor controlled rectifier element is a thyristor which is ignited by conduction of a phototransistor adapted to operate by light emission of a light emitting diode operated in response to the external control signal.

3. In a zero voltage switching solid state relay having a semiconductor controlled rectifier element which is ignited by an external control signal to feed a load with an alternating current, a transistor whose collector and emitter are respectively connected to the gate and the cathode of said semiconductor controlled rectifier element, and a voltage divider including first and second resistors connected in series across said rectifier element, the point of connection of said resistors being connected to the base of said transistor; the improvement comprising: a capacitor and a resistor connected in series between the base and the emitter of said transistor and which has a time constant sufficient to attain a hysteresis characteristic, and said semiconductor controlled rectifier element is a light-AC controlled element which is operated by a light emitting diode adapted to emit light in response to the external control signal.

4. A zero voltage switching solid state relay according to claim 3 wherein said transistor is one of a pair of N-P-N and P-N-P transistors whose collectors and emitters are commonly connected to the gate and the cathode of said semiconductor controlled rectifier element, respectively.

5. A zero voltage switching solid state relay comprising an AC controlled element which feeds a load with an alternating current; a semiconductor controlled rectifier element which is ignited by an external control signal thereby to ignite said AC controlled element, a transistor whose collector and emitter are respectively connected to the gate and the cathode of said semiconductor controlled rectifier element, and a voltage divider including first and second resistors connected in series across said rectifier element, the point of connection of said resistors being connected to the base of said transistor; the improvement comprising: a capacitor and a resistor connected in series between the base and the emitter of said transistor and which has a time constant sufficient to attain a hysteresis characteristic, and said semiconductor controlled rectifier element is a photothyristor which is operated by a light emitting diode adapted to emit light in response to the external control signal.

6. A zero voltage switching solid state relay comprising an AC controlled element which feeds a load with an alternating current; a semiconductor controlled rectifier element which is ignited by an external control signal thereby to ignite said AC controlled element, a transistor whose collector and emitter are respectively connected to the gate and the cathode of said semiconductor controlled rectifier element, and a voltage divider including first and second resistors connected in series across said rectifier element, the point of connection of said resistors being connected to the base of said transistor; the improvement comprising: a capacitor and a resistor connected in series between the base and the emitter of said transistor and which has a time constant sufficient to attain a hysteresis characteristic, and said semiconductor controlled rectifier element is a thyristor which is ignited by conduction of a phototransistor adapted to operate by light emission of a light emitting diode being operated in response to the external control signal.

7. A zero voltage switching solid state relay comprising an AC controlled element which feeds a load with an alternating current; a semiconductor controlled rectifier element which is ignited by an external control signal thereby to ignite said AC controlled element, a transistor whose collector and emitter are respectively connected to the gate and the cathode of said semiconductor controlled rectifier element, and a voltage divider including first and second resistors connected in series across said rectifier element, the point of connection of said resistors being connected to the base of said transistor; the improvement comprising: a capacitor and a resistor connected in series between the base and the emitter of said transistor and which has a time constant sufficient to attain a hysteresis characteristic, and said semiconductor controlled rectifier element is a light-AC controlled element which is operated by a light emitting diode adapted to emit light in response to the external control signal.

8. A zero voltage switching solid state relay according to claim 7 wherein said transistor is one of a pair of N-P-N and P-N-P transistors whose collectors and emitters are commonly connected to a gate and a cathode of said semiconductor controlled rectifier element, respectively.

* * * * *